United States Patent [19]

Kajimoto et al.

[11] Patent Number: 5,233,227
[45] Date of Patent: Aug. 3, 1993

[54] SOLAR BATTERY SYSTEMS FOR VEHICLES

[75] Inventors: Shinshi Kajimoto; Tooru Niitani; Osamu Michihira; Mitsutoshi Kuroiwa, all of Hiroshima, Japan

[73] Assignee: Mazda Motor Corporation, Hiroshima, Japan

[21] Appl. No.: 679,137

[22] Filed: Mar. 28, 1991

Related U.S. Application Data

[63] Continuation of Ser. No. 276,963, Nov. 28, 1988, abandoned.

[30] Foreign Application Priority Data

Nov. 30, 1987 [JP] Japan ................... 62-302597
Jan. 28, 1988 [JP] Japan ................... 63-018088

[51] Int. Cl.$^5$ .................. B60L 1/00; H02J 1/00; F25B 27/00; B60H 1/00
[52] U.S. Cl. ...................... 307/9.1; 307/38; 307/39; 62/235.1; 454/69
[58] Field of Search .......... 307/10 R, 9, 38, 39, 307/9.1, 10.1, 10.7; 136/291, 293; 98/2.01, 2.02, 900, 6; 180/65.3, 2.2, 903; 62/235.1; 324/426, 427, 433, 434; 340/636

[56] References Cited

U.S. PATENT DOCUMENTS

| | | | |
|---|---|---|---|
| 3,943,726 | 3/1976 | Miller | 180/65.3 |
| 4,310,770 | 1/1982 | Keener et al. | 307/39 X |
| 4,575,679 | 3/1986 | Chung et al. | 307/30 X |
| 4,580,071 | 4/1986 | Nakayama | 307/39 X |
| 4,617,473 | 10/1986 | Slavik | 307/39 X |
| 4,633,767 | 1/1987 | Sain | 62/235.1 |
| 4,658,599 | 4/1987 | Kajiwara | 62/235.1 X |
| 4,771,185 | 9/1988 | Feron et al. | 307/39 |
| 4,804,140 | 2/1989 | Cantrell | 98/900 X |

FOREIGN PATENT DOCUMENTS 52-53915 7/1977 Japan .

Primary Examiner—Sharon D. Logan
Attorney, Agent, or Firm—Sixbey, Friedman, Leedom & Ferguson

[57] ABSTRACT

A solar battery system for a vehicle comprises a solar battery mounted on a body of the vehicle, a load connector for connecting selectively at least one of electric equipments provided in the vehicle with the solar battery so as to apply an output of the solar battery to the electric equipment connected thereby with the solar battery, a battery output checker for detecting the magnitude of the output of the solar battery, and a controller operative to select in response to the magnitude of the output of the solar battery detected by the battery output checker one or more of the electric equipments provided in the vehicle, which operate with power consumption corresponding appropriately to the output of the solar battery, as one or more electric equipments to be connected by the load connector with the solar battery.

20 Claims, 9 Drawing Sheets

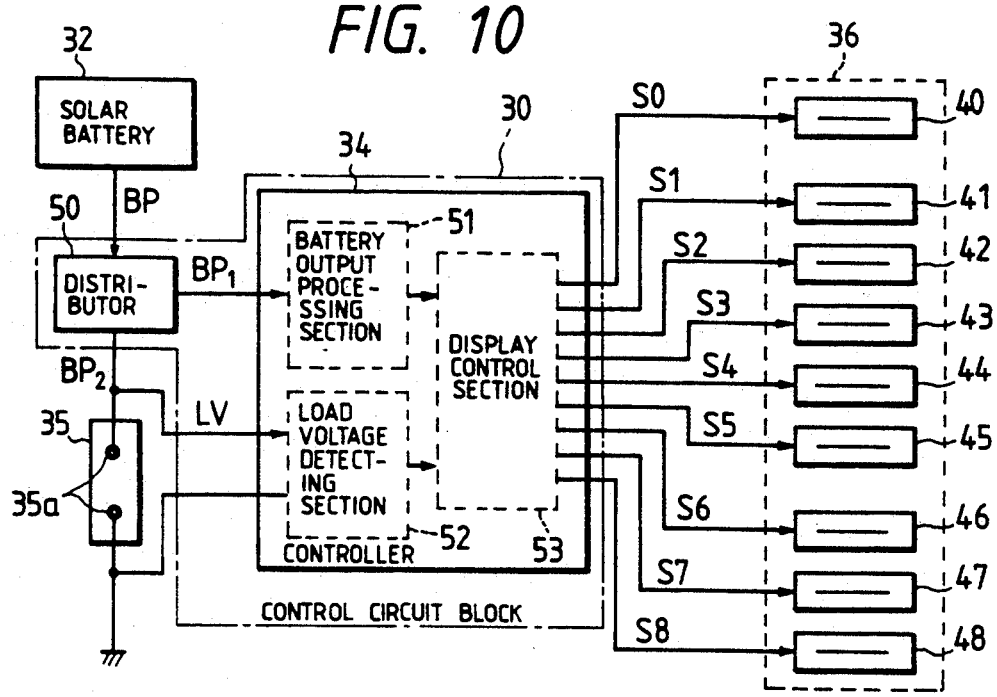
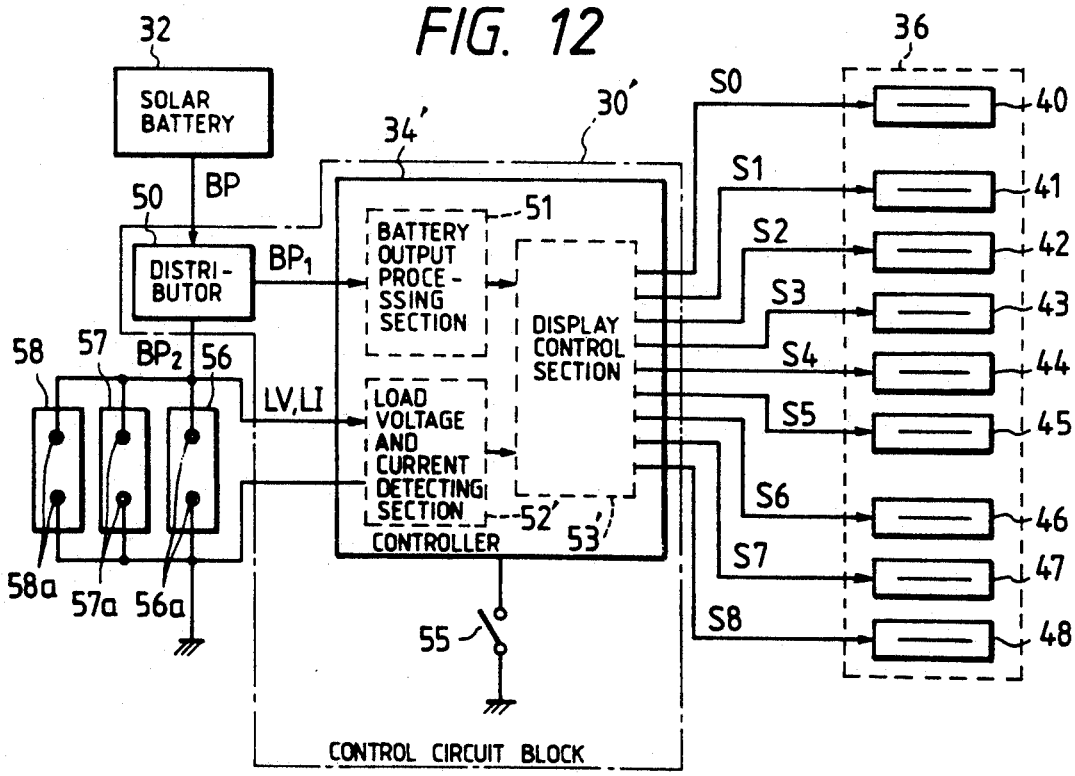

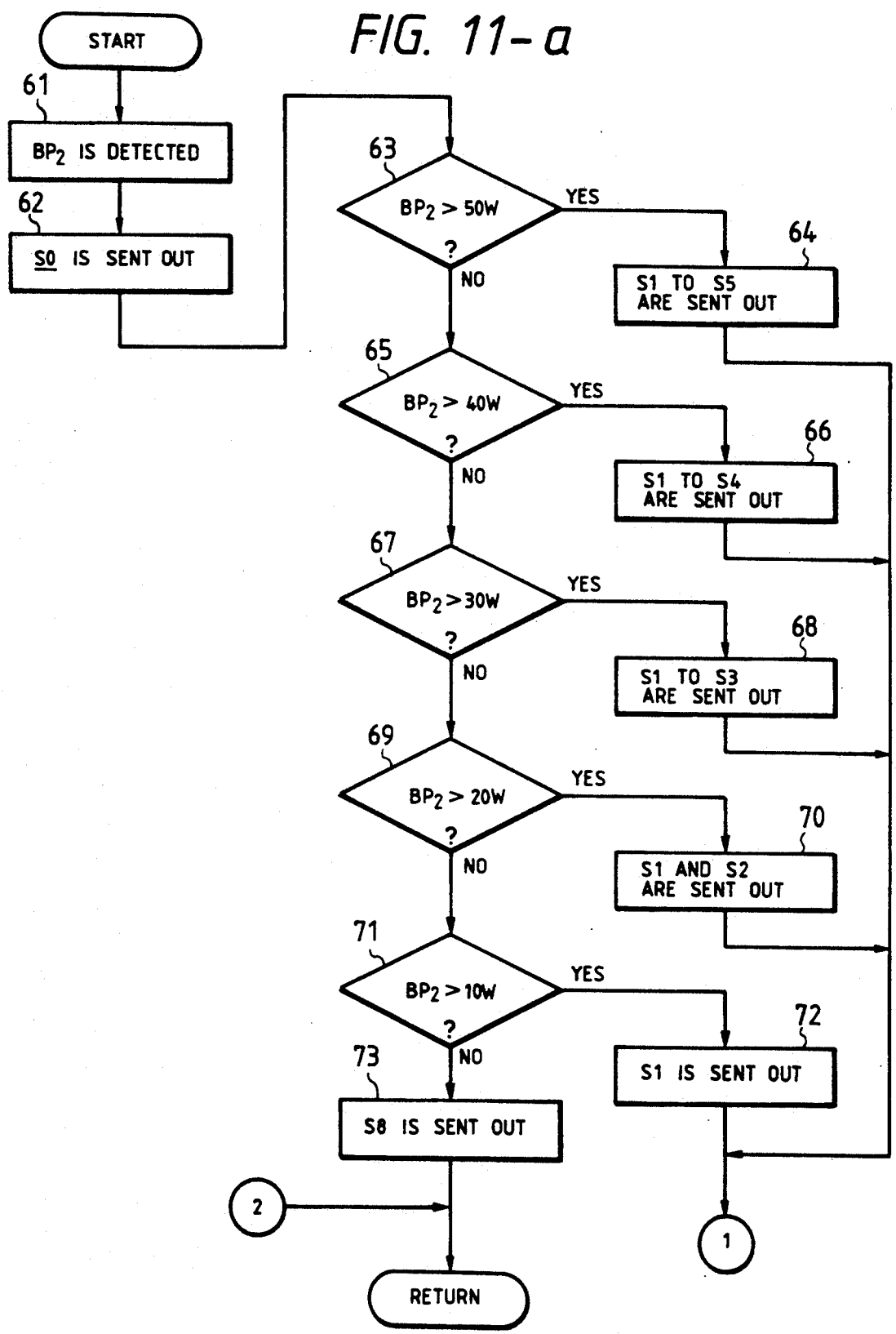
FIG. 11-a

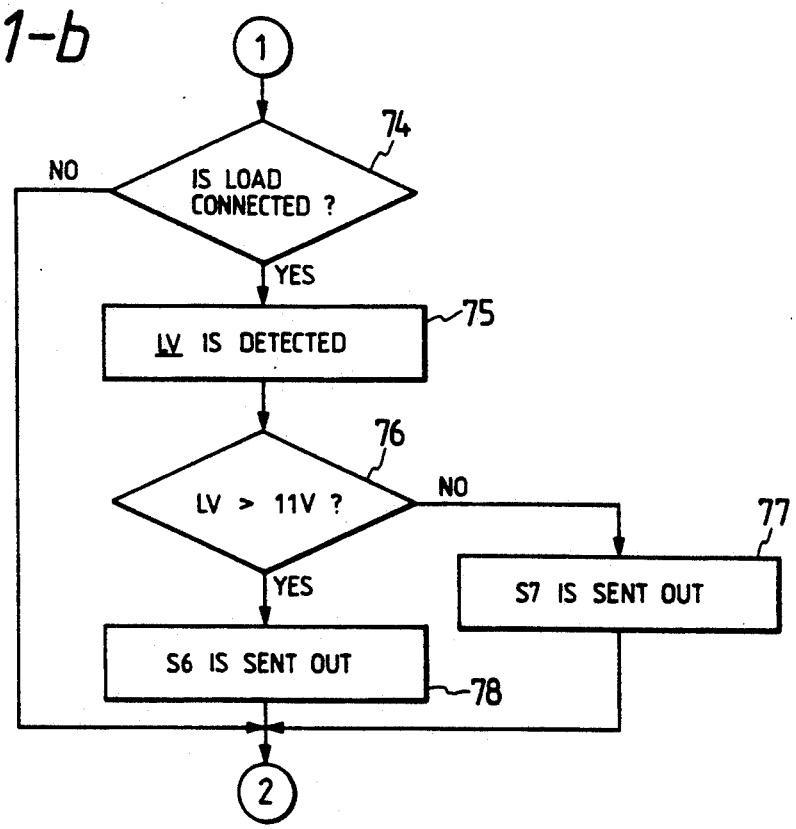
FIG. 11-b
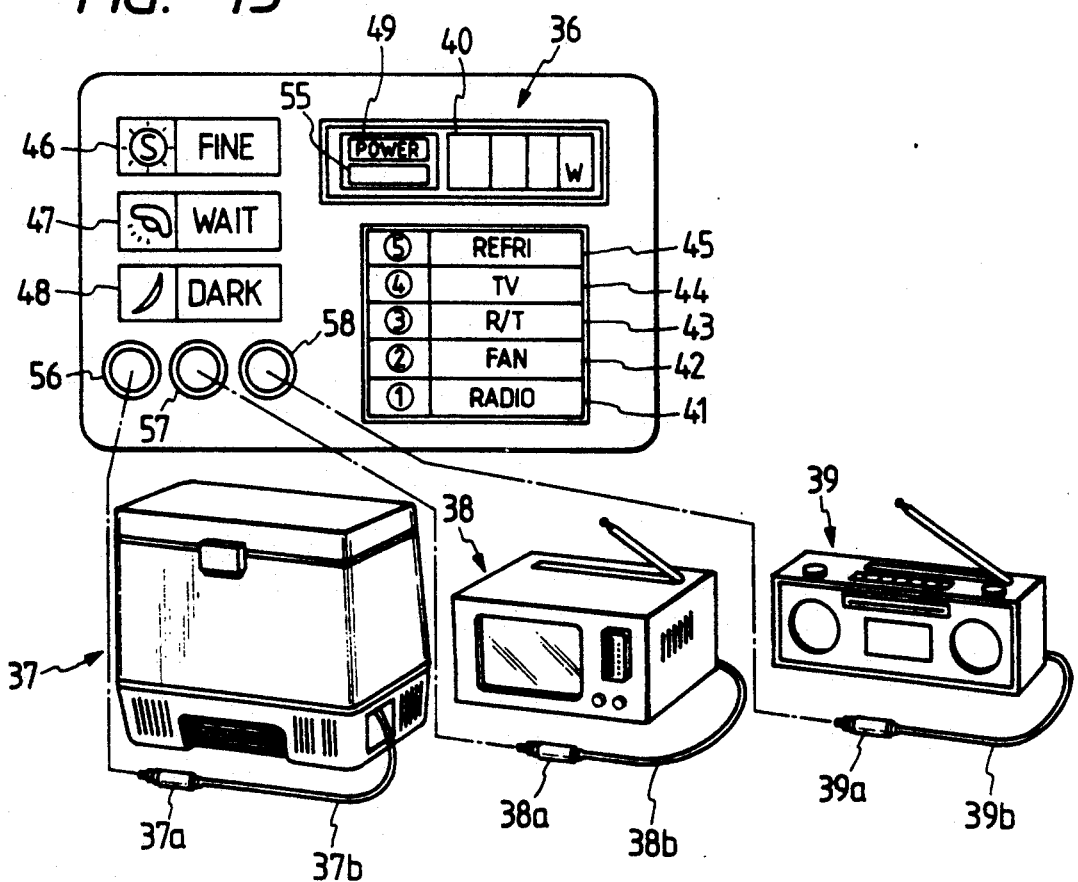
FIG. 13

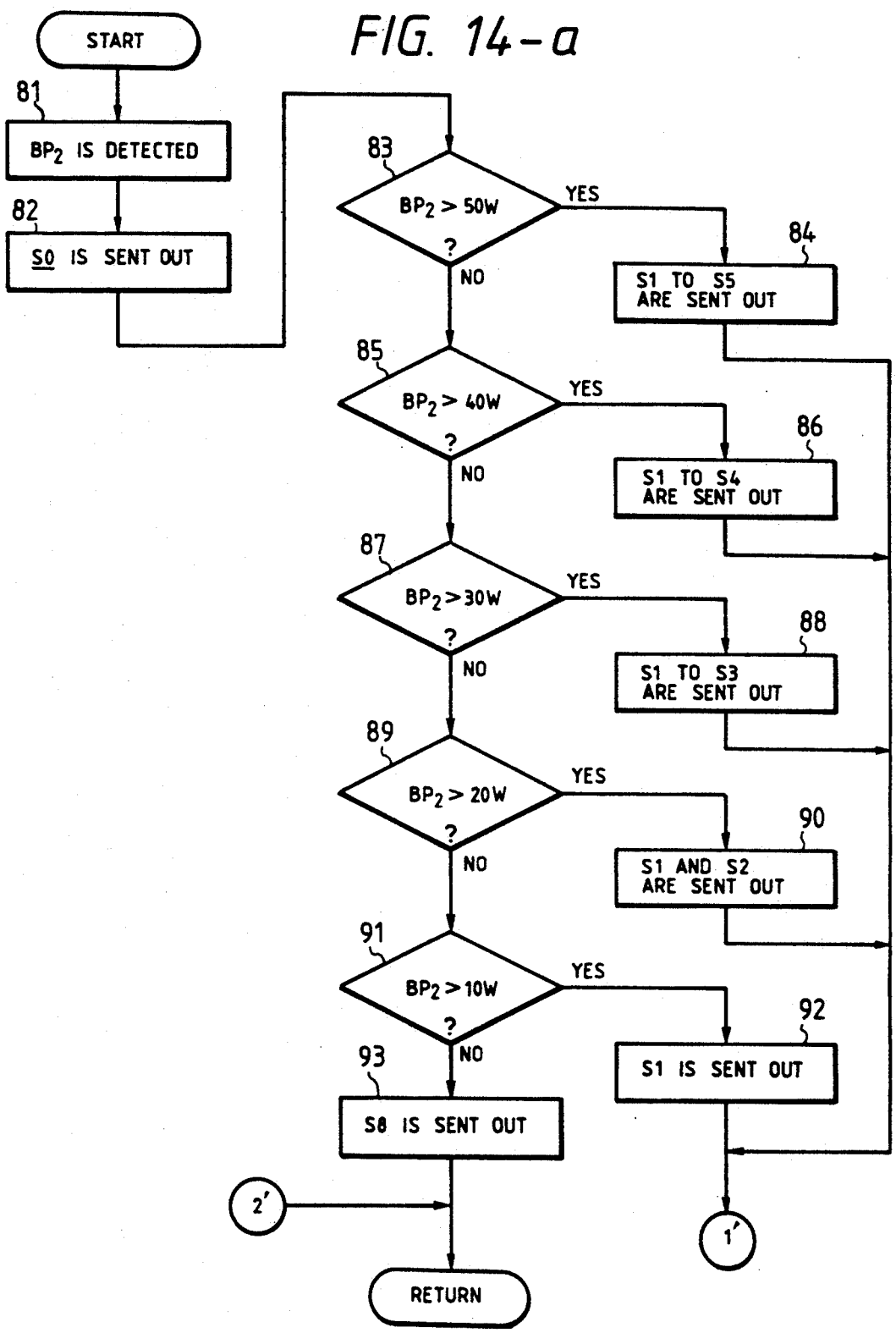
FIG. 14-a

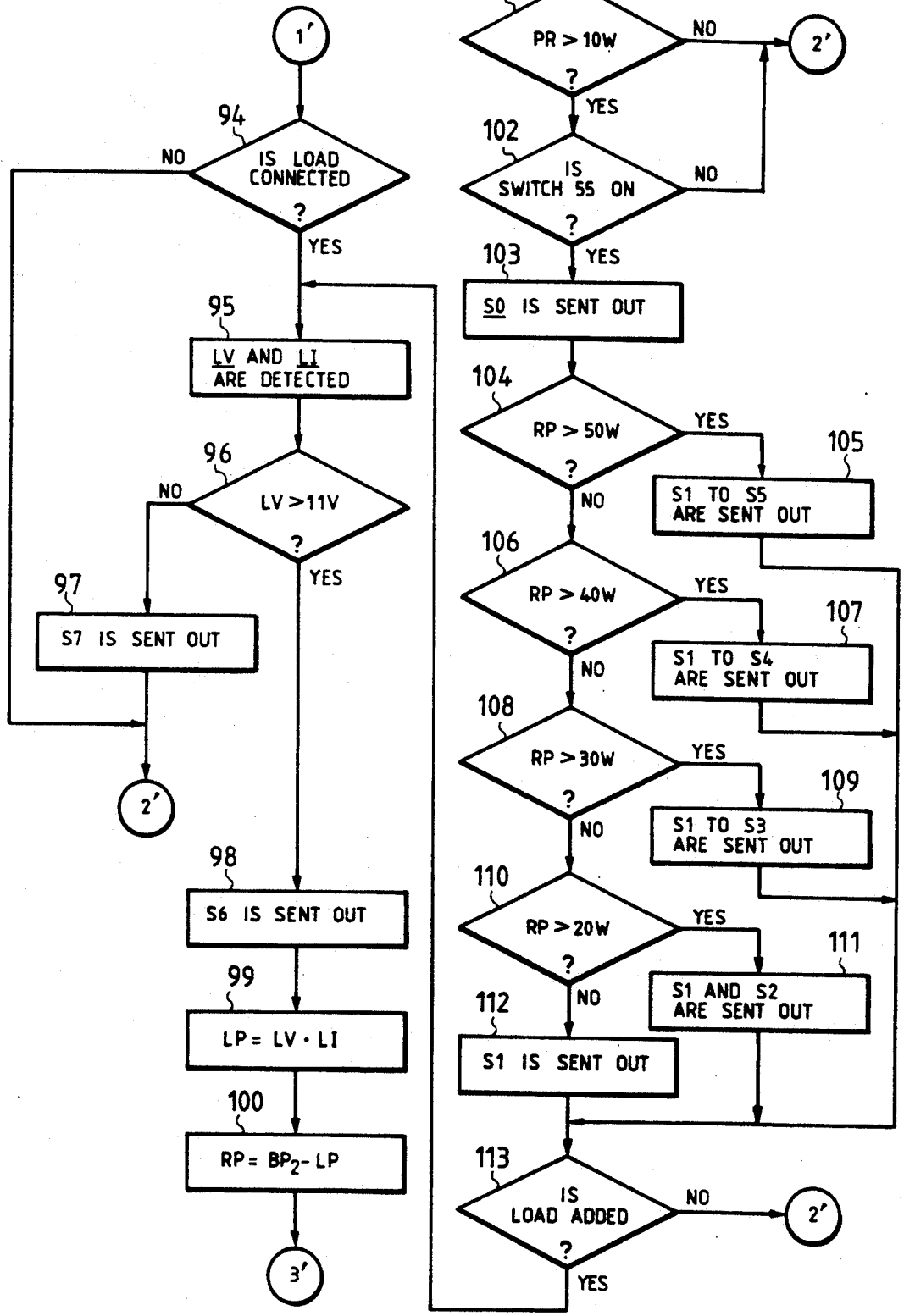
FIG. 14-b

SOLAR BATTERY SYSTEMS FOR VEHICLES

This application is a continuation of Ser. No. 07/276,963, filed Nov. 28, 1988, now abandoned.

BACKGROUND OF THE INVENTION

1. Field of the Invention

The present invention relates generally to solar battery systems for vehicles, and more particularly, to a system for supplying electric equipments provided in a vehicle with electric power produced by a solar battery mounted on a vehicle body, in which one or more of the electric equipments are selected to be supplied with the electric power so as to be driven efficiently in response to an output of electric power of the solar battery.

2. Description of the Prior Art

In the case where a vehicle, such as a passenger car, with a closed cabin is parked for hours to be exposed to the scorching heat of the sun, the temperature in the cabin may be extremely increased compared with the atmospheric temperature at the outside of the vehicle so that a driver or passenger getting on the vehicle feels uncomfortable and it takes a relatively long time to reduce the temperature in the cabin to be agreeable after an air conditioner provided in the vehicle is started to operate by the driver or passenger. For relieving such inconveniences, there has been proposed to provide a vehicle with a ventilating arrangement which includes ventilation ducts formed in a vehicle body to cause a cabin provided in the vehicle body to communicate with the outside of the vehicle and ventilating fans disposed in the ventilation ducts, respectively, and in which each ventilating fan is caused to operate for exhausting air staying at the cabin to the outside of the vehicle and taking fresh air in the cabin so as to reduce the temperature in the cabin when a difference between the temperature in the cabin and the atmospheric temperature at the outside of the vehicle reaches to a predetermined value. In the ventilating arrangement thus constituted in the vehicle, however, since the ventilating fans are usually driven by electric power supplied from a storage battery which the vehicle is equipped with, it is feared that the storage battery is subjected to an excessive load to drive the ventilating fans in the vehicle kept parking in which the storage battery cannot be charged.

Accordingly, it has been also proposed to use, in place of a storage battery, a solar battery which is operative to convert directly solar energy to electric energy in order to supply electric power for driving ventilating fans provided in such a ventilation arrangement as aforementioned, as disclosed in, for example, the Japanese patent specification published after examination under publication number 59-51451. In this case, the solar battery is mounted on a roof portion of a vehicle body to have a plurality of light receiving areas facing upward to the outside of the vehicle body so as to receive the sunlight effectively and the electric power obtained from the solar battery in response to the quantity of solar radiation supplied to the light receiving areas of the solar battery is applied to each of the ventilating fans to drive the same.

In the above mentioned ventilating system in which the solar battery is used as a power source for supplying the ventilating fans with electric power, all of the ventilating fans included in the system or some of the ventilating fans selected by a driver or passenger in the vehicle are driven at the same time by the electric power supplied from the solar battery, so that the number of the ventilating fans supplied at the same time with the electric power from the solar battery is determined without reference to variations in an output of electric power of the solar battery which varies proportional to the quantity of the solar radiation supplied to the solar battery. Then, the solar battery which produces the output of electric power proportional to the quantity of the solar radiation supplied thereto and is provided with an optimal operating point in its output characteristic may be caused to work at an operating area which does not include the optimal operating point in its output characteristic for supplying all or some of the ventilating fans selected by the driver or passenger with the electric power at the same time when the solar radiation supplied to the solar battery is relatively small, for example. In a situation wherein the solar battery is caused to work at an operating point which is apart from the optimal operating point in its output characteristic, the solar battery is not utilized efficiently and the ventilating system cannot be caused to operate effectively.

Meanwhile, a vehicle develops a tendency to be equipped with various kinds of electric equipments, such as an electric refrigerator, electric warmer, portable television receiver, radio receiver and so on, in addition to the ventilating arrangement, and since it is feared that electric power from a storage battery provided in the vehicle is running short if each of the electric equipments is driven by the electric power supplied from the storage battery in the vehicle kept parking, it has been further proposed to use a solar battery mounted on a vehicle body as a power source for driving some of the electric equipments in the vehicle kept parking. In such a case, the electric equipments are different in power consumption with each other, and when one or more of the electric equipments which are of relatively large power consumption are selected to be driven by electric power supplied from the solar battery, the solar battery may be also caused to work at an operating area which does not include an optimal operating point in its output characteristic for supplying the selected electric equipments with the electric power so as not to be utilized efficiently and therefore, if the worst happens, the selected electric equipments cannot be made to operate properly.

OBJECTS AND SUMMARY OF THE INVENTION

It is an object of the present invention to provide a solar battery system for a vehicle in which a solar battery is used selectively as a power source for supplying electric equipments provided in the vehicle with electric power, which avoids the aforementioned problems and disadvantages encountered with the prior art.

Another object of the present invention is to provide a solar battery system for a vehicle in which a solar battery is used selectively as a power source for supplying electric equipments provided in the vehicle with electric power, in which one or more of the electric equipments are selected automatically to be supplied with the electric power from the solar battery so that the solar battery is maintained to work at a relatively narrow operating area including an optimal operating point in its output characteristic.

A further object of the present invention is to provide a solar battery system for a vehicle in which a solar battery is used selectively as a power source for supplying electric equipments provided in the vehicle with electric power, in which one or more of the electric equipments are selected automatically to be supplied with the electric power from the solar battery so as to be driven properly and efficiently in response to an output of electric power of the solar battery.

A still further object of the present invention is to provide a solar battery system for a vehicle in which a solar battery is used selectively as a power source for supplying electric equipments provided in the vehicle with electric power, in which one or more of the electric equipments are selected automatically to be supplied with the electric power from the solar battery so as to be driven properly in response to an output of electric power of the solar battery and a display indicating one or more selected electric equipments is made.

According to the present invention, there is provided a solar battery system for a vehicle, which comprises a solar battery mounted on a body of the vehicle, a load connector for connecting selectively at least one of electric equipments provided in the vehicle with the solar battery so as to apply an output of the solar battery to the electric equipment connected thereby with the solar battery, a battery output checker for detecting the magnitude of the output of the solar battery, and a controller for selecting in response to the magnitude of the output of the solar battery detected by the battery output checker one or more of the electric equipments provided in the vehicle, which operate with power consumption corresponding appropriately to the output of the solar battery, as one or more electric equipments to be connected by the load connector with the solar battery.

In one embodiment of the invention, a plurality of electric equipments of the same type are provided as the electric equipments connected selectively by the load connector with the solar battery and the controller is operative to determine the number of the electric equipments of the same type so as to select one or more electric equipments which operate with power consumption corresponding appropriately to the output of the solar battery and are to be connected with the solar battery.

In another embodiment of the invention, the system further comprises, in addition to the solar battery, the load connector, the battery output checker and the controller, a display device connected with the controller for indicating one or more electric equipments selected by the controller.

In the system thus constituted in accordance with the present invention, one or more of the electric equipments provided in the vehicle, which operate with power consumption corresponding appropriately to the output of the solar battery, are selected by the controller automatically in response to the magnitude of the output of the solar battery detected by the battery output checker and connected by the load connector with the solar battery so as to be driven by electric power from the solar battery. Accordingly, the solar battery is maintained to work at a relatively narrow operating area including an optimal operating point in its output characteristic when the selected one or more electric equipments are supplied with the electric power from the solar battery, and therefore the solar battery can be utilized efficiently and the one or more electric equipments selected to be driven by the electric power from the solar battery can be caused to operate properly and efficiently.

In the embodiment, one or more of the electric equipments provided in the vehicle and selected by the controller as one or more electric equipments operating with power consumption corresponding appropriately to the output of the solar battery, are indicated by the display device, and therefore a driver or passenger in the vehicle can pick out surely one or more electric equipments which is to be driven to operate properly by the electric power from the solar battery in accordance with the indication made by the display device.

The above, and other objects, features and advantages of the present invention will become apparent from the following detailed description which is to be read in conjunction with the accompanying drawings.

BRIEF DESCRIPTION OF THE DRAWINGS

FIG. 10 is a schematic block diagram of the second embodiment;

FIGS. 11-a and 11-b are flow charts showing an example of an operation program for a control performed by a microcomputer which is used in a controller employed in the second embodiment;

FIG. 12 is a schematic block diagram of a third embodiment of solar battery system for a vehicle according to the present invention;

FIG. 13 is a schematic illustration showing an example of a displaying portion of the third embodiment which is applied to the vehicle shown in FIG. 7 and examples of electric equipments used in the vehicle shown in FIG. 7; and FIGS. 14-a and 14-b are flow charts showing an example of an operation program for a control performed by a microcomputer which is used in a controller employed in the third embodiment.

DESCRIPTION OF THE PREFERRED EMBODIMENTS

The invention will now be described by way of example with reference to the accompanying drawings.

Figure 1:
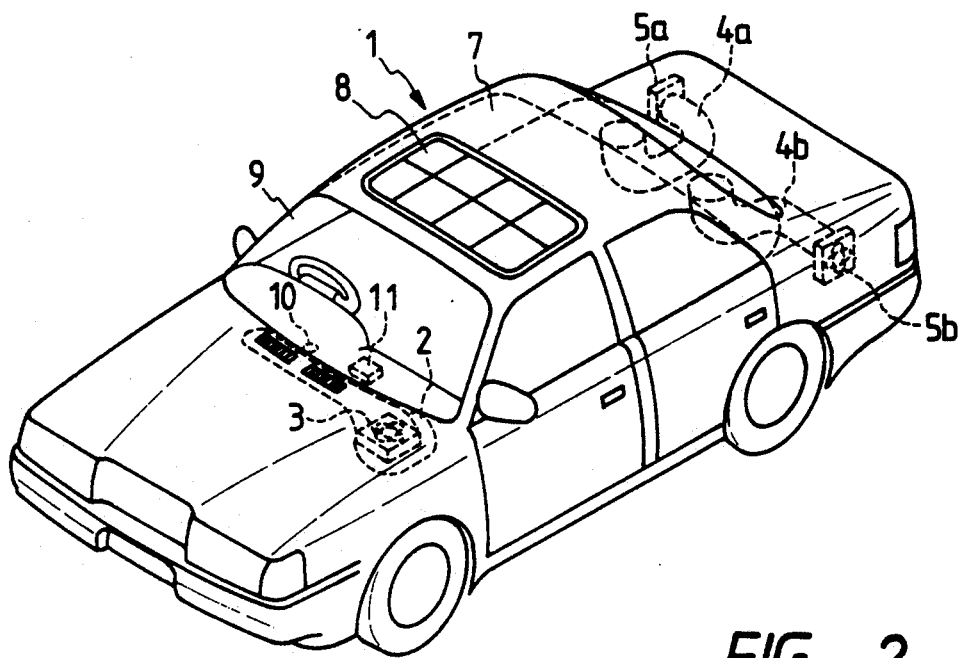
FIG. 1 is a schematic perspective view showing an example of a vehicle to which a first embodiment of solar battery system for a vehicle according to the present invention is applied.
Figure 2:
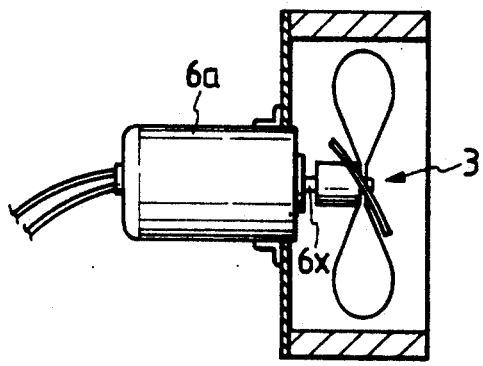
FIG. 2 is a schematic illustration showing examples of a ventilating fan and a fan motor employed in the first embodiment.

Referring to FIG. 1, a first embodiment of solar battery system for a vehicle according to the present invention is applied to a vehicle having a body 1. The body 1 is provided with a front ventilation duct 2 and a pair of rear ventilation ducts 4a and 4b for causing a cabin formed in the body 1 to communicate with the outside of the body 1. Ventilating fans 3, 5a and 5b are disposed in the front and rear ventilation ducts 2, 4a and 4b, respectively. The ventilating fans 3, 5a and 5b are constituted in the same manner and, as shown in FIG. 2, the ventilating fan 3 is fixed on a shaft 6x of a fan motor 6a which is provided for rotating the ventilating fan 3. Similarly, the ventilating fans 5a and 5b are also fixed respectively on shafts of fan motors 6b and 6c (not shown in FIGS. 1 and 2) which are provided for rotating the ventilating fans 5a and 5b, respectively.

When the fan motor 6a is driven to rotate the ventilating fan 3, fresh air is taken in the cabin through the front ventilation duct 2 from the outside, and when the fan motors 6b and 6c are driven to rotate the ventilating fans 5a and 5b, respectively, air having stayed at the cabin is exhausted to the outside through the rear ventilation ducts 4a and 4b from the cabin.

The body 1 is also provided on a roof 7 thereof with a solar battery 8 which is to be used, as occasion demands, as a power source for supplying the fan motors 6a, 6b and 6c with electric power. The solar battery 8 is mounted on the roof 7 to have a plurality of light receiving elements being covered by a transparent protective plate and facing upward to the outside of the body 1 so as to receive the sunlight and produce an output of electric power proportional to the quantity of solar radiation supplied to the body 1 under a condition of normal function. The output of electric power of the solar battery 8 is represented by a product of an output voltage and an output current of the solar battery 8.

Figure 3:
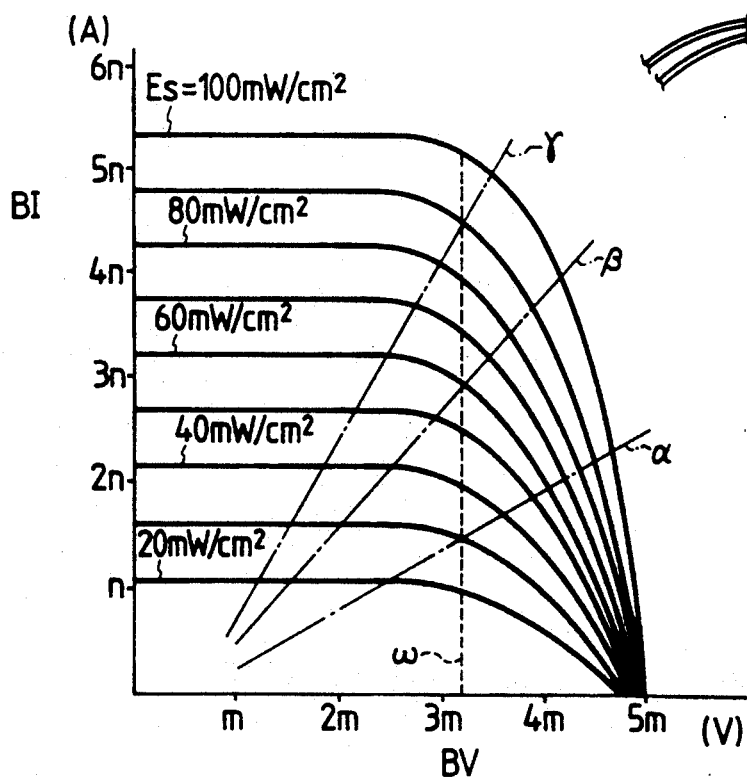
FIG. 3 is a graphic diagram used for explanation of a solar battery employed in the first embodiment.

One example of an output characteristic of the solar battery 8 is shown in the graphic diagram of FIG. 3 with the axis of abscissa representing the output voltage (BV) of the solar battery 8 and the axis of ordinate representing the output current (BI) of the solar battery 8. In the graphic diagram of FIG. 3, m and n are positive constants respectively, and each of curves shows a relation between the output voltage BV and output current BI under the condition wherein the quantity of solar radiation (Es) supplied to the body 1 is 20 mW/cm$^2$, 40 mW/cm$^2$, 60 mW/cm$^2$, 80 mW/cm$^2$ or 100 mW/cm$^2$. As understood apparently from the output characteristic shown in FIG. 3, the maximum value of the output voltage BV is kept almost constant regardless of the quantity of solar radiation Es supplied to the body 1 and the output current BI under the condition of a certain constant output voltage BV varies substantially in proportion to variations to increase to 100 mW/cm$^2$ from 20 mW/cm$^2$ in the quantity of solar radiation Es supplied to the body 1. A major part of the output of electric power obtained from the solar battery 8 which is represented in the form of the product of the output current BI and the output voltage BV is supplied selectively to one or more of the fan motors 6a, 6b and 6c to drive the same.

In the body 1, an actinometer 10 is disposed in a front portion of the cabin to be positioned in the vicinity of a lower portion of a front windshield 9, as shown in FIG. 1. The actinometer 10 is operative to detect the quantity of solar radiation supplied to the body 1 and produce a detection output in the form of an output current thereof which is proportional to the detected quantity of solar radiation.

Figure 4:
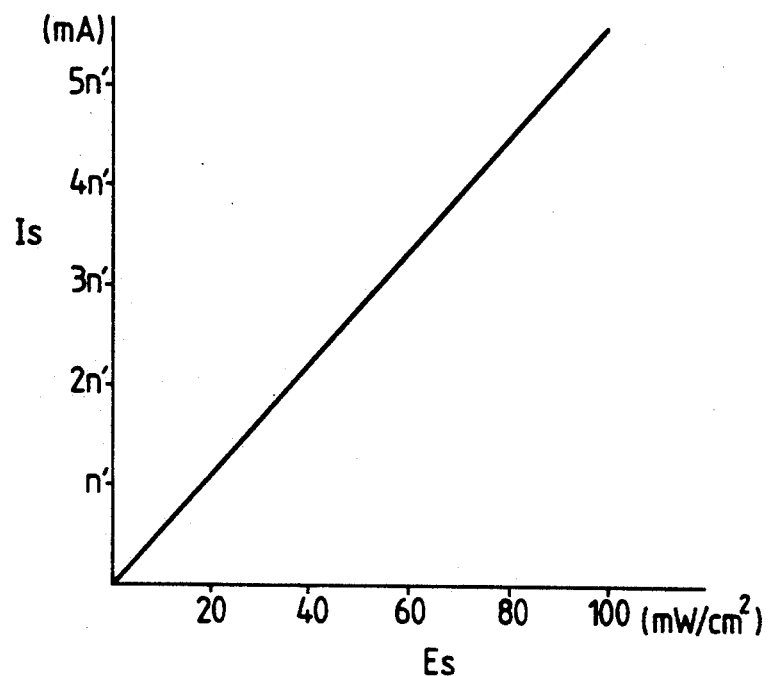
FIG. 4 is a graph diagram used for explanation of an actinometer employed in the first embodiment.

One example of an output characteristic of the actinometer 10 is shown in the graphic diagram of FIG. 4 in which the axis of abscissa represents the quantity of solar radiation (Es) supplied to the body 1, the axis of ordinate represents the output current (Is) of the actinometer 10, and n' is a positive constant. As understood apparently from the output characteristic shown in FIG. 4, the output current Is of the actinometer 10 varies in proportion to variations in the quantity of solar radiation Es supplied to the body 1.

Further, in the body 1, a control circuit block 11 is provided in the front portion of the cabin for controlling the operation of each of the fan motors 6a, 6b and 6c.

Figure 5:
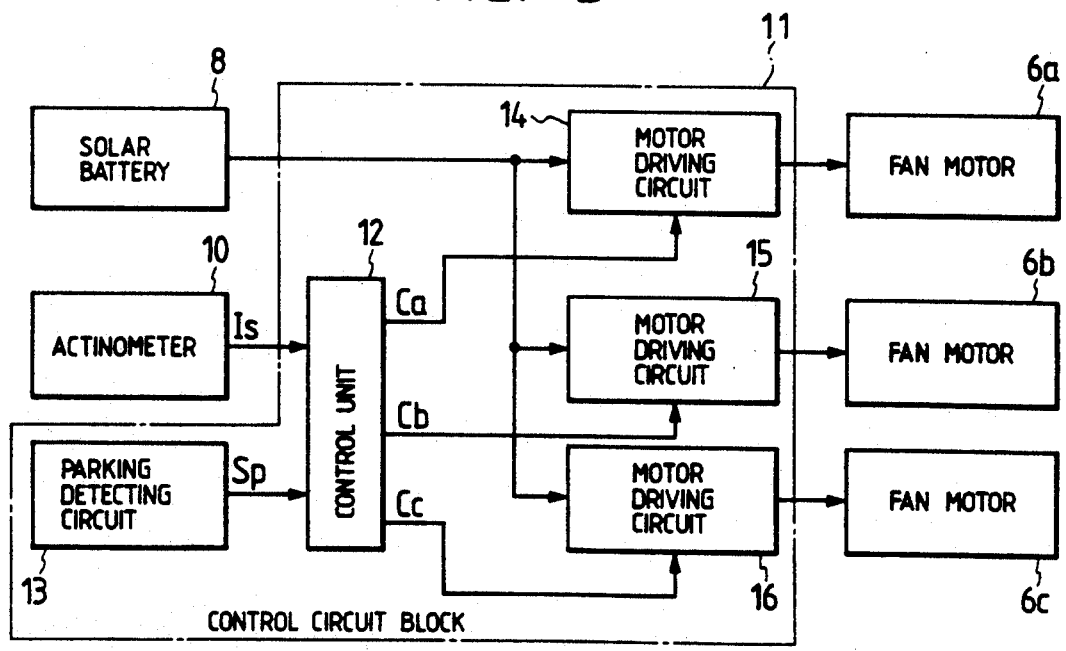
FIG. 5 is a schematic block diagram of the first embodiment.

The front ventilation duct 2, rear ventilation ducts 4a and 4b, ventilating fans 3, 5a and 5b, solar battery 8, actinometer 10 and control circuit block 11 provided as mentioned above constitute the first embodiment of solar battery system for a vehicle according to the present invention and the control circuit block 11 is connected electrically with the ventilating fans 3, 5a and 5b, solar battery 8, and actinometer 10 in such a manner as shown in FIG. 5 by way of example.

The example of the control circuit block 11 shown in FIG. 5 contains a control unit 12, a parking detecting circuit 13 for detecting a situation in which the vehicle is parked, motor driving circuits 14, 15 and 16. The control unit 12 receives a detection output Sp from the parking detecting circuit 13 and the output current Is from the actinometer 10 and is operative to produce control signals Ca, Cb and Cc based on the detection output Sp and the output current Is and supply selectively the motor driving circuits 14, 15 and 16 with the control signals Ca, Cb and Cc, respectively. The output of the solar battery 8 is supplied to each of the motor driving circuits 14, 15 and 16, and the motor driving circuits 14, 15 and 16 are operative to apply the output of the solar battery 8 to the fan motors 6a, 6b and 6c, respectively, in response to the control signals Ca, Cb and Cc, so that the fan motors 6a, 6b and 6c are selectively driven by the electric power supplied from the solar battery 8 to rotate the ventilating fans 3, 5a and 5c, respectively.

In the first embodiment constituted as mentioned above, when the detection output Sp of the parking detecting circuit 13, which indicates that the vehicle is parked, is supplied to the control unit 12, the control unit 12 detects the quantity of solar radiation Es supplied to the body 1 based on the output current Is from the actinometer 10. Then, when the quantity of solar radiation Es detected by the control unit 12 is relatively small, such as to be larger than 20 mW/cm$^2$ but not more than 40 mW/cm$^2$, the control unit 12 supplies the motor driving circuit 14 with the control signal Ca. The motor driving circuit 14 supplied with the control signal Ca applies the output of the solar battery 8 to the fan motor 6a to drive the same so as to rotate the ventilating fans 3. Accordingly, in this case, the fan motor 6a is selected to be coupled through the motor driving circuit 14 with the solar battery 8 as a load thereof, and therefore a load line of the fan motor 6a is drawn on the output characteristic of the solar battery 8 as shown with a dot-dash line α in the graphic diagram of FIG. 3, so that the solar battery 8 works at a relatively narrow operating area including an optimal operating point residing on a broken line φ on its output characteristic shown in the graphic diagram of FIG. 3 for supplying the fan motor 6a with electric power.

When the quantity of solar radiation Es detected by the control unit 12 is middle, such as to be larger than 40 mW/cm² but not more than 70 mW/cm², the control unit 12 supplies the motor driving circuits 14 and 15 with the control signals Ca and Cb, respectively. The motor driving circuit 14 supplied with the control signal Ca applies the output of the solar battery 8 to the fan motor 6a to drive the same so as to rotate the ventilating fan 3, and the motor driving circuit 15 supplied with the control signal Cb applies also the output of the solar battery 8 to the fan motor 6b to drive the same so as to rotate the ventilating fan 5a. Accordingly, the fan motors 6a and 6b are selected to be coupled through the motor driving circuits 14 and 15 respectively with the solar battery 8 as a load thereof, and therefore a load line of both the fan motors 6a and 6b is drawn on the output characteristic of the solar battery 8 as shown with a dot-dash line β in the graphic diagram of FIG. 3, so that the solar battery 8 works also at a relatively narrow operating area including an optimal operating point residing on the broken line ω on its output characteristic shown in the graphic diagram of FIG. 3 for supplying both the fan motors 6a and 6b with electric power.

Further, when the quantity of solar radiation Es detected by the control unit 12 is relatively large, such as to be larger than 70 mW/cm², the control unit 12 supplies the motor driving circuits 14, 15 and 16 with the control signals Ca, Cb and Cc, respectively. The motor driving circuit 14 supplied with the control signal Ca applies the output of the solar battery 8 to the fan motor 6a to drive the same so as to rotate the ventilating fan 3, the motor driving circuit 15 supplied with the control signal Cb applies the output of the solar battery 8 to the fan motor 6b to drive the same so as to rotate the ventilating fan 5a, and the motor driving circuit 16 supplied with the control signal Cc applies the output of the solar battery 8 to the fan motor 6c to drive the same so as to rotate the ventilating fan 5b. Accordingly, the fan motors 6a, 6b and 6c are selected to be coupled through the motor driving circuits 14, 15 and 16 respectively with the solar battery 8 as a load thereof, and therefore a load line of both the fan motors 6a, 6b and 6c is drawn on the output characteristic of the solar battery 8 as shown with a dot-dash line γ in the graphic diagram of FIG. 3, so that the solar battery 8 works also at a relatively narrow operating area including an optimal operating point residing on the broken line ω on its output characteristic shown in the graphic diagram of FIG. 3 for supplying all of the fan motors 6a, 6b and 6c with electric power.

As described above, since the number of the fan motors which are driven by the electric power of the solar battery 8 is increased in proportion to the increase of the quantity of solar radiation Es supplied to the body 1, namely, the increase of the output of the solar battery 8, the solar battery 8 is desirably maintained to work at the relatively narrow operating area including the optimal operating point on its output characteristic for supplying one or more of the fan motors 6a, 6b and 6c and the electric power from the solar battery 8 is utilized effectively for driving properly one or more of the fan motors 6a, 6b and 6c.

The control unit 12 which is operative to control the operation of the motor driving circuits 14, 15 and 16 in the manner as mentioned above may be constituted by a microcomputer. In such a case, an operation program of the microcomputer constituting the control unit 12 for conducting the control for the motor driving circuits 14, 15 and 16 is carried out in accordance with a flow chart shown in FIG. 6.

Figure 6:
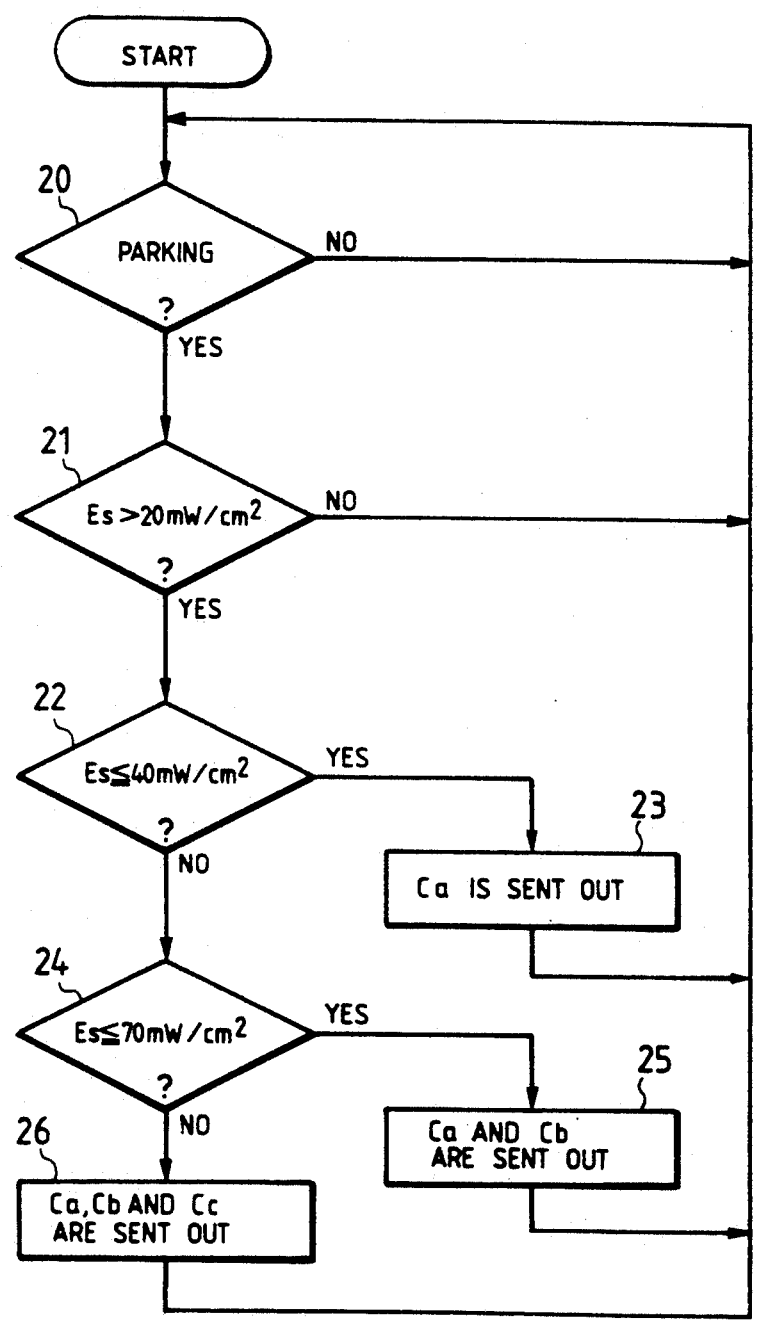
FIG. 6 is a flow chart showing an example of an operation program for a control performed by a microcomputer which is used in a control unit employed in the first embodiment.

According to the flow chart shown in FIG. 6, first, in decision 20, it is checked based on the detection output Sp from the parking detecting circuit 13 whether the vehicle is in parking or not. When the vehicle is not in parking, the check at the decision 20 is repeated. Then, when the vehicle is in parking, it is checked based on the output current Is from the actinometer 10 whether the quantity of solar radiation Es supplied to the body 1 is larger than 20 mW/cm² or not, in decision 21. If the quantity of solar radiation Es is equal to or smaller than 20 mW/cm², the step returns to the decision 20.

When it is clarified in the decision 21 that the quantity of solar radiation Es is larger than 20 mW/cm², it is checked whether the quantity of solar radiation Es is equal to or smaller than 40 mW/cm², in decision 22. When the quantity of solar radiation Es is equal to or smaller than 40 mW/cm², the control signal Ca is sent out to the motor driving circuit 14, in process 23, and then the step returns to decision 20. The motor driving circuit 14 to which the control signal Ca is supplied causes the fan motor 6a to be driven by the electric power from the solar battery 8.

On the other hand, when the quantity of solar radiation Es is larger than 40 mW/cm², it is checked whether the quantity of solar radiation Es is equal to or smaller than 70 mW/cm², in decision 24. When the quantity of solar radiation Es is equal to or smaller than 70 mW/cm², the control signals Ca and Cb are sent out to the motor driving circuits 14 and 15, respectively, in process 25, and then the step returns to decision 20. The motor driving circuits 14 and 15 to which the control signals Ca and Cb are supplied, respectively, cause the fan motors 6a and 6b to be driven by the electric power from the solar battery 8.

Further, when it is clarified in the decision 24 that the quantity of solar radiation Es is larger than 70 mW/cm², the control signals Ca, Cb and Cc are sent out to the motor driving circuits 14, 15 and 16, respectively, in process 26, and then the step returns to decision 20. The motor driving circuits 14, 15 and 16 to which the control signals Ca, Cb and Cc are supplied, respectively, cause the fan motors 6a, 6b and 6c to be driven by the electric power from the solar battery 8.

Although three fan motors 6a, 6b and 6c are selectively driven by the electric power from the solar battery 8 in the first embodiment described above, it is to be understood that two or more than three fan motors can be provided to be driven by the electric power from the solar battery 8. Further, although the solar battery 8 is mounted directly on the roof 7 of the body 1 of the vehicle in the first embodiment described above, it is also understood that the system according to the present invention is not limited thereto, and that a solar battery used in the system according to the present invention can be fixed to, for example, a slidable sunshine roof panel which is provided on a roof portion of a vehicle body having an opening for communicating a cabin formed in the vehicle body with the outside and operative to shut the opening and keep the opening open.

Figure 7:
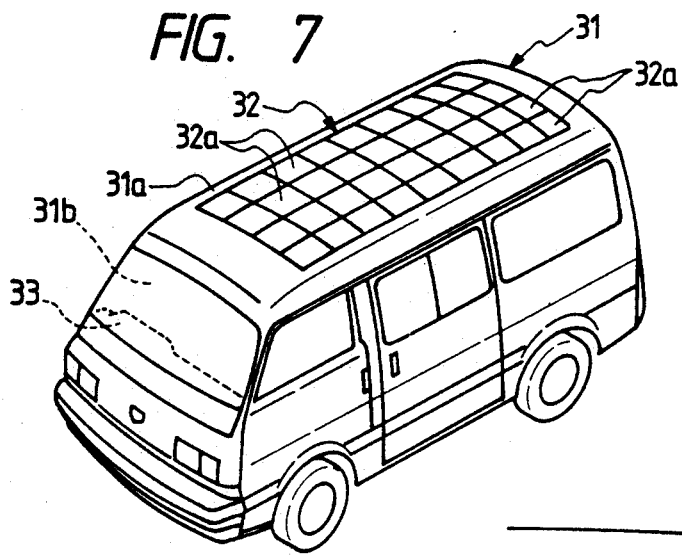
FIG. 7 is a schematic perspective view showing an example of a vehicle to which a second embodiment of solar battery system for a vehicle according to the present invention is applied.

FIG. 7 shows an example of a vehicle of the cab-over-engine van type to which a second embodiment of solar battery system of a vehicle according to the present invention.

Referring to FIG. 7, the vehicle to which the second embodiment is applied has a body 31 provided on a roof 31a thereof with a solar battery 32. The solar battery 32 has a plurality of light receiving elements 32a being covered by a transparent protective plate and facing upward to the outside of the body 31 so as to receive the sunlight and produces an output of electric power proportional to the quantity of solar radiation supplied to the body 31 in the same manner as the solar battery 8 used in the first embodiment.

Figure 8:
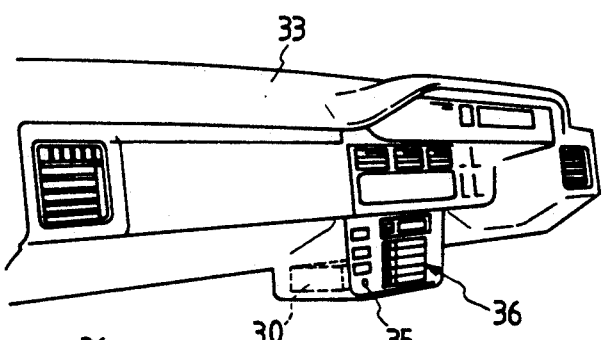
FIG. 8 is a schematic illustration showing a front portion of a cabin formed in the vehicle shown in FIG. 7.

The body 31 is also provided with a cabin 31b formed therein and an instrument panel 33 is provided in a front portion of the cabin 31b. In the body 31, a control circuit block 30 to which the output of electric power from the solar battery 32 is applied, a load connector 35 coupled electrically with the control circuit block 30 and a display device 36 also coupled electrically with the control circuit block 30 are disposed under the instrument panel 33, as shown in FIG. 8.

Figure 9:
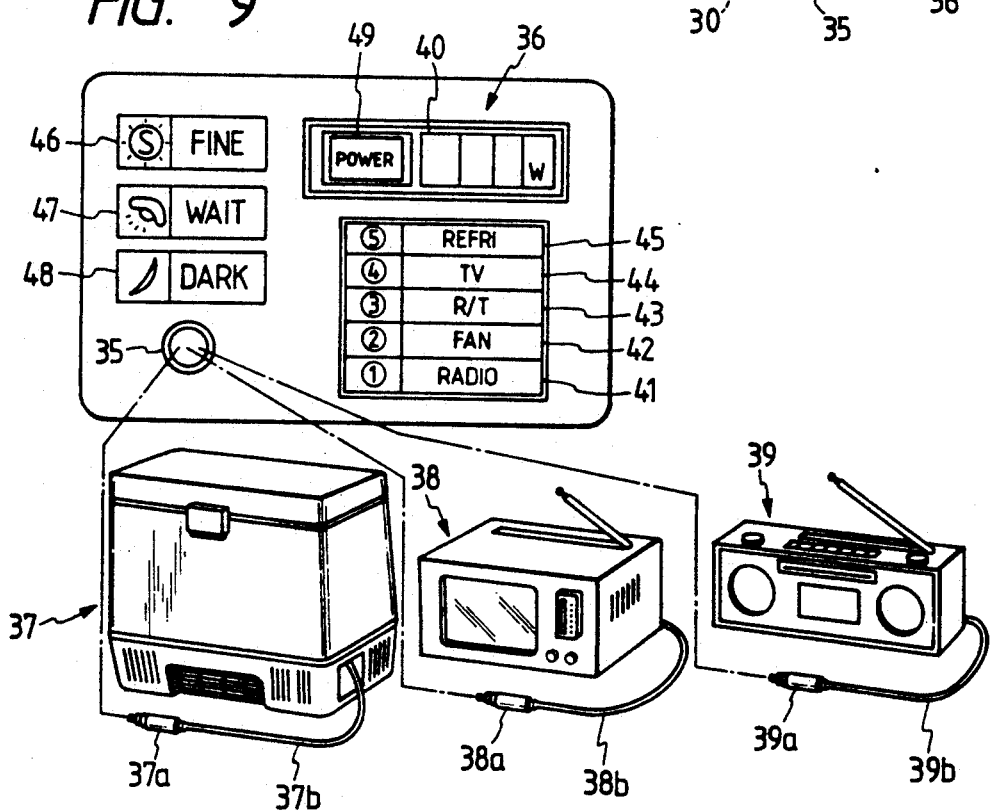
FIG. 9 is a schematic illustration showing an example of a displaying portion of the second embodiment and examples of electric equipments used in the vehicle shown in FIG. 7.

The load connector 35 serves to connect one of various kinds of electric equipments, such as an electric refrigerator 37, an portable television receiver 38 and a cassette tape player 39 combined with a radio receiver, as shown in FIG. 9, used in the cabin with the control circuit block 30 so that the connected electric equipment is supplied with electric power from the solar battery 32, and is formed into a jack in which, for example, a plug 37a attached to a power cable 37b of the electric refrigerator 37, a plug 38a attached to a power cable 38b of the portable television receiver 38, or a plug 39a attached to a power cable 39b of the cassette tape player 39 is inserted.

As shown in FIG. 9, the display device 36 has a power indicator 40 for displaying the value of an output of the solar battery 32, equipment indicators 41, 42, 43, 44 and 45 for displaying electric equipments which can be driven properly by the electric power from the solar battery 32, a normal operation indicator 46 for indicating that an electric equipment connected through the load connector 35 with the control circuit block 30 is supplied with electric power sufficient for operating properly, an inadequate operation indicator 47 for indicating that an electric equipment connected through the load connector 35 with the control circuit block 30 is supplied with insufficient electric power and thereby caused to operate inadequately, and an inoperativeness indicator 48 for indicating that an electric equipment connected through the load connector 35 with the control circuit block 30 is supplied with extremely small electric power and thereby caused to be inoperative. The equipment indicators 41 to 45 are arranged to correspond to, for example, a radio receiver, a ventilating fan, a cassette tape player combined with a radio receiver, a portable television receiver, and an electric refrigerator, respectively. The normal operation indicator 46, inadequate operation indicator 47 and inoperativeness indicator 48 are operative to display "FINE", "WAIT" and "DARK", respectively. The display device 36 is further provided with a power switch 49 used for making the control circuit block 30 operate or inoperative.

The control circuit block 30, solar battery 32, load connector 35 and display device 36 provided as mentioned above constitute the second embodiment of solar battery system for a vehicle according to the present invention and the control circuit block 30 is connected electrically with the solar battery 32, load connector 35 and display device 36 in such a manner as shown in a block diagram of FIG. 10 by way of example.

Referring to the block diagram of FIG. 10, the control circuit block 30 comprises a controller 34 which is connected with a pair of connecting terminals 35a constitute the load connector 35 and the display device 36, and a distributor 50 provided for dividing an output of electric power BP of the solar battery 32 into a couple of solar battery powers $BP_1$ and $BP_2$ each being proportional to the output of electric power BP. The solar battery power $BP_1$ is selected to be much smaller than the solar battery power $BP_2$. Then, the solar battery power $BP_1$ obtained from the distributor 50 is applied to the controller 34, and the solar battery power $BP_2$ obtained also from the distributor 50 is applied as the output of the solar battery 32 to the load connector 35.

The controller 34 contains a battery output processing section 51 connected to the distributor 50 for detecting the output of the solar battery 32 based on the solar battery power $BP_1$, a load voltage detecting section 52 connected to the load connector 35 for detecting a load voltage LV across an electric equipment coupled with the connecting terminals 35a constituting the load connector 35, and a display control section 53 for controlling the operation of the display device 36 in response to outputs of the battery output processing section 51 and the load voltage detecting section 52.

In the second embodiment constituted as mentioned above, when the power switch 49 is turned on to cause the control circuit block 30 operate, the battery output processing section 51 in the controller 34 operates to detect, based on the solar battery power $BP_1$ applied thereto from the distributor 50, the value of the solar battery power $BP_2$ applied to the load connector 35, and supply the display control section 53 with a detection output representing the value of the solar battery power $BP_2$. The display control section 53 produces a driving signal S0 based on the detection output of the battery output processing section 51 and supplies the power indicator 40 in the display device 36 with the driving signal S0, and the power indicator 40 is driven by the driving signal S0 to display the value of the solar battery power $BP_2$ as the value of the output of the solar battery 32.

The display control section 53 operates also to produce selectively driving signals S1, S2, S3, S4 and S5 for driving the equipment indicators 41, 42, 43, 44 and 45, respectively, in response to the detection output of the battery output processing section 51 in such a manner that the driving signals S1 to S5 are produced to select the electric equipments corresponding to the equipment indicators 41, 42, 43, 44 and 45 when the detection output of the battery output processing section 51 indicates that the solar battery power $BP_2$ is larger than, for example, 50 W; the driving signals S1 to S4 are produced to select the electric equipments corresponding to the equipment indicators 41, 42, 43 and 44 when the detection output of the battery output processing section 51 indicates that the solar battery power $BP_2$ is equal to or smaller than 50 W but larger than, for example, 40 W; the driving signals S1 to S3 are produced to select the electric equipments corresponding to the equipment indicators 41, 42 and 43 when the detection output of the battery output processing section 51 indicates that the solar battery power $BP_2$ is equal to or smaller than 40 W but larger than, for example, 30 W; the driving signals S1 and S2 are produced to select the electric equipments corresponding to the equipment indicators 41 and 42 when the detection output of the battery output processing section 51 indicates that the solar battery power $BP_2$ is equal to or smaller than 30 W but larger than, for example, 20 W; the driving signal S1 is produced to select the electric equipment corresponding to the equipment indicator 41 when the detection output of the battery output processing section 51 indicates that the solar battery power $BP_2$ is equal to or smaller than 20 W but larger than, for example, 10 W. Then, one or more of the equipment indicators 41 to 45 driven by corresponding ones of the driving signals S1 to S5 operate to display one or more selected electric equipments which can be supplied with electric power sufficient for operating properly through the load connector 35.

The display control section 53 operates further to produce a driving signal S8 for driving the inoperativeness indicator 48 when the detection output of the battery output processing section 51 indicates that the solar battery power $BP_2$ is equal to or smaller than 10 W, and the inoperativeness indicator 48 driven by the driving signal S8 makes a display of "DARK" to indicate that none of the electric equipments can be supplied with electric power for operating through the load connector 35.

In the case where one of the electric equipments used in the vehicle is coupled with the connecting terminals 35a constituting the load connector 35, the load voltage detecting section 52 operates to detect the load voltage LV across the electric equipment coupled with the connecting terminals 35a and supply the display control section 53 with a detection output representing the value of the load voltage LV. The display control section 53 produces a driving signal S6 for driving the normal operation indicator 46 when the detection output of the load voltage detecting section 52 indicates that the load voltage LV is higher than, for example, 11 V, and the normal operation indicator 46 driven by the driving signal S6 makes a display of "FINE" to indicate that the electric equipment coupled with the connecting terminals 35a is being supplied with electric power sufficient for operating properly through the load connector 35. Further, The display control section 53 produces a driving signal S7 for driving the inadequate operation indicator 47 when the detection output of the load voltage detecting section 52 indicates that the load voltage LV is equal to or lower than 11 V, and the inadequate operation indicator 47 driven by the driving signal S7 makes a display of "WAIT" to indicate that the electric equipment coupled with the connecting terminals 35a is being supplied with insufficient electric power through the load connector 35.

The controller 34 which is operative to control the operation of the display device 36 in the manner as mentioned above may be constituted by a microcomputer. In such a case, an operation program of the microcomputer constituting the controller 34 for conducting the control for the display device 36 is carried out in accordance with a flow chart shown in FIGS. 11-a and 11-b.

According to the flow chart shown in FIGS. 11-a and 11-b, first, in process 61, the solar battery power $BP_2$ is detected based on the solar battery power $BP_1$ which is applied to the battery output processing section 51, and in process 62, the driving signal S0 for driving the power indicator 40 is sent out.

Then, in decision 63, it is checked whether the solar battery power $BP_2$ is larger than 50 W or not. When it is clarified in decision 63 that the solar battery power $BP_2$ is larger than 50 W, the driving signals S1 to S5 for driving the equipment indicators 41 to 45 respectively are sent out, in process 64, and then the step advances to decision 74.

If it is clarified in decision 63 that the solar battery power $BP_2$ is equal to or smaller than 50 W, it is checked whether the solar battery power $BP_2$ is larger than 40 W or not, in decision 65. When it is clarified in the decision 65 that the solar battery power $BP_2$ is larger than 40 W, the driving signals S1 to S4 for driving the equipment indicators 41 to 44 respectively are sent out, in process 66, and then the step advances to the decision 74.

If it is clarified in the decision 65 that the solar battery power $BP_2$ is equal to or smaller than 40 W, it is checked whether the solar battery power $BP_2$ is larger than 30 W or not, in decision 67. When it is clarified in the decision 67 that the solar battery power $BP_2$ is larger than 30 W, the driving signals S1 to S3 for driving the equipment indicators 41 to 43 respectively are sent out, in process 68, and then the step advances to the decision 74.

If it is clarified in the decision 67 that the solar battery power $BP_2$ is equal to or smaller than 30 W, it is checked whether the solar battery power $BP_2$ is larger than 20 W or not, in decision 69. When it is clarified in the decision 69 that the solar battery power $BP_2$ is larger than 20 W, the driving signals S1 and S2 for driving the equipment indicators 41 and 42 respectively are sent out, in process 70, and then the step advances to the decision 74.

If it is clarified in the decision 69 that the solar battery power $BP_2$ is equal to or smaller than 20 W, it is checked whether the solar battery power $BP_2$ is larger than 10 W or not, in decision 71. When it is clarified in the decision 71 that the solar battery power $BP_2$ is larger than 10 W, the driving signal S1 for driving the equipment indicator 41 is sent out, in process 72, and then the step advances to the decision 74.

If it is clarified in the decision 71 that the solar battery power $BP_2$ is equal to or smaller than 10 W, the driving signal S8 for driving the inoperativeness indicator 48 is sent out, in process 73, and then the step returns to the process 61.

In the decision 74, it is checked whether an electric equipment is coupled with the load connector 35 as a load of the solar battery 32 or not. When any electric equipment is not coupled with the load connector 35, the step returns to the process 61.

On the other hand, the electric equipment is coupled with the load connector 35, the load voltage LV is detected, in process 75. Then, in decision 76, it is checked whether the load voltage LV detected in the process 75 is higher than 11 V or not. When the load voltage LV is equal to or lower than 11 V, the driving signal S7 for driving the inadequate operation indicator 47 is sent out, in process 77, and the step returns to the process 61. To the contrary, when the load voltage LV is higher than 11 V, the driving signal S6 for driving the normal operation indicator 46 is sent out, in process 78, and the step returns to the process 61.

FIG. 12 shows a block diagram of the third embodiment of solar battery system of a vehicle according to the present invention and FIG. 13 shows a part of the third embodiment. The third embodiment may be applied also to such a vehicle as shown in FIG. 7 and has many portions and devices provided in the same manner as corresponding portions and devices of the second embodiment described above.

In FIGS. 12 and 13, portions, devices and electric equipments corresponding to those of FIGS. 10 and 9 are marked with the same references and further description thereof will be omitted.

In the third embodiment, three load connectors 56, 57 and 58 constituted by a pair of connecting terminals 56a, a pair of connecting terminals 57a and a pair of connecting terminals 58a, respectively, are provided to be connected in parallel with each other with a distributor 50 which produces solar battery powers $BP_1$ and $BP_2$ from an output of electric power of a solar battery 32. Each of the load connectors 56, 57 and 58 is formed in the same manner as the load connector 35 of the second embodiment and, for example, an electric refrigerator 37, a portable television receiver 38 and a cassette tape player 39 combined with a radio receiver are coupled with the load connectors 56, 57 and 58, respectively.

A display device 36 in the third embodiment is accompanied with a power switch 49 and an auxiliary switch 55 provided to a control circuit block 30'. The control circuit block 30' comprises the distributor 50 and a controller 34' which includes a battery output processing section 51, a load voltage and current detecting section 52' connected to the load connectors 56, 57 and 58 for detecting a load voltage LV across one or more electric equipments coupled with one or more of the load connectors 56, 57 and 58 detecting also a load current LI flowing through one or more electric equipments coupled with one or more of the load connectors 56, 57 and 58, and a display control section 53' operative to control the display device 36 in one of two different control modes selected by the auxiliary switch 55 connected thereto.

In the third embodiment constituted by the control circuit block 30', solar battery 32, display device 36 and load connectors 56, 57 and 58, the controller 34' including the battery output processing section 51, load voltage and current detecting section 52' and display control section 53' operates in almost the same manner as the controller 34 including the battery output processing section 51, load voltage detecting section 52 and display control section 53 of the second embodiment for causing the display device 36 to make displays in relation to the solar battery power $BP_2$ obtained from the distributor 50 when the auxiliary switch 55 is kept in the OFF state. However, when the auxiliary switch 55 is kept in the ON state, the controller 34' operates to cause the display device 36 to make displays in relation to remainder power obtained at one or more of the load connectors 56, 57 and 58.

That is, when the auxiliary switch 55 is turned on under a condition wherein an electric equipment is coupled with, for example, the load connector 56 so as to be driven by the electric power supplied through the load connector 56 from the distributor 50, the battery output processing section 51 in the controller 34' operates to detect, based on the solar battery power $BP_1$ applied thereto from the distributor 50, the value of the solar battery power $BP_2$ supplied from the distributor 50, and supply the display control section 53' with a detection output representing the value of the solar battery power $BP_2$.

At the same time, the load voltage and current detecting section 52' operates to detect the load voltage LV across the electric equipment coupled with the load connector 56 and the load current LI flowing through the electric equipment coupled with the load connector 56 and calculate a load power LP which is consumed in the electric equipment coupled with the load connector 56 by obtaining the product of the load voltage LV and the load current LI. Then, the load voltage and current detecting section 52' supplies the display control section 53' with a detection output representing the value of the load power LP.

The display control section 53' to which the detection output of the battery output processing section 51 and the detection output of the load voltage and current o detecting section 52' are supplied, operates to calculate a remainder power RP, which can be applied through the load connector 57 or 58 to an additional electric equipment in the case where the additional electric equipment is coupled with the load connector 57 or 58, by subtracting the load power LP represented by the detection output of the load voltage and current detecting section 52' from the solar battery power $BP_2$ represented by the detection output of the battery output processing section 51 ($RP=BP_2-LP$). Then, the display control section 53' produces a driving signal S0 corresponding to the remainder power RP calculated as mentioned above and supplies the power indicator 40 in the display device 36 with the driving signal S0, and the power indicator 40 is driven by the driving signal S0 to display the value of the remainder power RP as the value of the output of the solar battery 32.

The display control section 53' also produces selectively driving signals S1, S2, S3, S4 and S5 for driving equipment indicators 41, 42, 43, 44 and 45 in the display device 36, respectively, in response to the value of the remainder power RP in such a manner that the driving signals S1 to S5 are produced to select the electric equipments corresponding to the equipment indicators 41, 42, 43, 44 and 45 when the remainder power RP is larger than, for example, 50 W; the driving signals S1 to S4 are produced to select the electric equipments corresponding to the equipment indicators 41, 42, 43 and 44 when the remainder power RP is, equal to or smaller than 50 W but larger than, for example, 40 W; the driving signals S1 to S3 are produced to select the electric equipments corresponding to the equipment indicators 41, 42 and 43 when the remainder power RP is equal to or smaller than 40 W but larger than, for example, 30 W; the driving signals S1 and S2 are produced when the remainder power RP is equal to or smaller than 30 W but larger than, for example, 20 W; the driving signal S1 is produced to select the electric equipments corresponding to the equipment indicators 41 and 42 when the remainder power RP is equal to or smaller than 20 W but larger than, for example, 10 W. Then, one or more of the equipment indicators 41 to 45 driven by corresponding ones of the driving signals S1 to S5 operate to display one or more selected electric equipments which can be supplied with electric power sufficient for operating properly through the load connector 57 or 58.

The display control section 53' operates further to produce a driving signal S8 for driving an inoperativeness indicator 48 in the display device 36 when the remainder power RP is equal to or smaller than 10 W, and the inoperativeness indicator 48 driven by the driving signal S8 makes a display of "DARK" to indicate that none of the electric equipments can be supplied with electric power for operating through the load connector 57 or 58.

In the case where the additional electric equipment is coupled with, for example, the load connector 57, the controller 34' repeats the above mentioned operation to cause the display device 36 to make a display of an electric equipment which can be supplied with electric power sufficient for operating properly through the load connector 58, if any.

Further, the display control section 53' produces a driving signal S6 for driving a normal operation indicator 46 in the display device 36 when the detection output of the load voltage and current detecting section 52' indicates that the load voltage LV is higher than, for example, 11 V, so that the normal operation indicator 46 driven by the driving signal S6 makes a display of "FINE" to indicate that one or more electric equipments coupled with one or more of the load connectors 56, 57 and 58 are being supplied with electric power sufficient for operating properly, and also produces a driving signal S7 for driving an inadequate operation indicator 47 in the display device 36 when the detection output of the load voltage and current detecting section 52' indicates that the load voltage LV is equal to or lower than 11 V, so that the inadequate operation indicator 47 driven by the driving signal S7 makes a display of "WAIT" to indicate that one or more electric equipments coupled with one or more of the load connectors 56, 57 and 58 are being supplied with insufficient electric power.

The controller 34' which is operative to control the operation of the display device 36 in the manner as mentioned above may be constituted by a microcomputer. In such a case, an operation program of the microcomputer constituting the controller 34' for conducting the control for the display device 36 is carried out in accordance with a flow chart shown in FIGS. 14-a and 14-b.

According to the flow chart shown in FIGS. 14-a and 14-b, first, in process 81, the solar battery power $BP_2$ is detected based on the solar battery power $BP_1$ which is applied to the battery output processing section 51, and in process 82, the driving signal S0 for driving the power indicator 40 is sent out.

Then, in decision 83, it is checked whether the solar battery power $BP_2$ is larger than 50 W or not. When it is clarified in decision 83 that the solar battery power $BP_2$ is larger than 50 W, the driving signals S1 to S5 for driving the equipment indicators 41 to 45 respectively are sent out, in process 84, and then the step advances to decision 94.

If it is clarified in decision 83 that the solar battery power $BP_2$ is equal to or smaller than 50 W, it is checked whether the solar battery power $BP_2$ is larger than 40 W or not, in decision 85. When it is clarified in the decision 85 that the solar battery power $BP_2$ is larger than 40 W, the driving signals S1 to S4 for driving the equipment indicators 41 to 44 respectively are sent out, in process 86, and then the step advances to the decision 94.

If it is clarified in the decision 85 that the solar battery power $BP_2$ is equal to or smaller than 40 W, it is checked whether the solar battery power $BP_2$ is larger than 30 W or not, in decision 87. When it is clarified in the decision 87 that the solar battery power $BP_2$ is larger than 30 W, the driving signals S1 to S3 for driving the equipment indicators 41 to 43 respectively are sent out, in process 88, and then the step advances to the decision 94.

If it is clarified in the decision 87 that the solar battery power $BP_2$ is equal to or smaller than 30 W, it is checked whether the solar battery power $BP_2$ is larger than 20 W or not, in decision 89. When it is clarified in the decision 89 that the solar battery power $BP_2$ is larger than 20 W, the driving signals S1 and S2 for driving the equipment indicators 41 and 42 respectively are sent out, in process 90, and then the step advances to the decision 94.

If it is clarified in the decision 89 that the solar battery power $BP_2$ is equal to or smaller than 20 W, it is checked whether the solar battery power $BP_2$ is larger than 10 W or not, in decision 91. When it is clarified in the decision 91 that the solar battery power $BP_2$ is larger than 10 W, the driving signal S1 for driving the equipment indicator 41 is sent out, in process 92, and then the step advances to the decision 94.

If it is clarified in the decision 91 that the solar battery power $BP_2$ is equal to or smaller than 10 W, the driving signal S8 for driving the inoperativeness indicator 48 is sent out, in process 93, and then the step returns to the process 81.

In the decision 94, it is checked whether an electric equipment is coupled with one of the load connectors 56, 57 and 58 as a load of the solar battery 32 or not. When any electric equipment is not coupled with one of the load connectors 56, 57 and 58, the step returns to the process 81.

On the other hand, the electric equipment is coupled with one of the load connectors 56, 57 and 58, the load voltage LV and the load current LI are detected, in process 95. Then, in decision 96, it is checked whether the load voltage LV detected in the process 95 is higher than 11 V or not. When the load voltage LV is equal to or lower than 11 V, the driving signal S7 for driving the inadequate operation indicator 47 is sent out, in process 97, and the step returns to the process 81. To the contrary, when the load voltage LV is higher than 11 V, the driving signal S6 for driving the normal operation indicator 46 is sent out, in process 98, and the step advances to the process 99.

In the process 99, the load power LP is calculated by making the product of the load voltage LV and the load current LI, and in process 100, the remainder power RP is calculated by subtracting the load power LP from the solar battery power $BP_2$.

Then, in decision 101, it is checked whether the remainder power RP obtained in the process 100 is larger than 10 W or not. If the remainder power RP is equal to or smaller than 10 W, the step returns to the process 81, and if the remainder power RP is larger than 10 W, it is checked in decision 102 whether the auxiliary switch 55 is kept in the ON state or not. When it is clarified in decision 102 that the auxiliary switch 55 is kept in the OFF state, the step returns to the process 81.

On the other hand, if it is clarified in decision 102 that the auxiliary switch 55 is kept in the ON state, the driving signal S0 for causing the power indicator 40 to display the value of the remained power RP is sent out, in process 103.

After that, in decision 104, it is checked whether the remainder power RP is larger than 50 W or not. When it is clarified in decision 104 that the remainder power RP is larger than 50 W, the driving signals S1 to S5 for driving the equipment indicators 41 to 45 respectively are sent out, in process 105, and then the step advances to decision 113.

If it is clarified in decision 104 that the remainder power RP is equal to or smaller than 50 W, it is checked whether the remainder power RP is larger than 40 W or not, in decision 106. When it is clarified in the decision 106 that the remainder power RP is larger than 40 W, the driving signals S1 to S4 for driving the equipment indicators 41 to 44 respectively are sent out, in process 107, and then the step advances to the decision 113.

If it is clarified in the decision 106 the remainder power RP is equal to or smaller than 40 W, it is checked whether the remainder power RP is larger than 30 W or not, in decision 108. When it is clarified in the decision 108 that the remainder power RP is larger than 30 W, the driving signals S1 to S3 for driving the equipment indicators 41 to 43 respectively are sent out, in process 109, and then the step advances to the decision 113.

If it is clarified in the decision 108 the remainder power RP is equal to or smaller than 30 W, it is checked whether the remainder power RP is larger than 20 W or not, in decision 110. When it is clarified in the decision 110 that the remainder power RP is larger than 20 W, the driving signals S1 and S2 for driving the equipment indicators 41 and 42 respectively are sent out, in process 111, and then the step advances to the decision 113.

If it is clarified in the decision 110 that the remainder power RP is equal to or smaller than 20 W, the driving signal S1 for driving the equipment indicator 41 is sent out, in process 112, and then the step advances to the decision 113.

In the decision 113, it is checked whether an electric equipment is additionally coupled with one of the load connectors 56, 57 and 58 as an additional load of the solar battery 32 or not. When any electric equipment is not added, the step returns to the process 81.

On the other hand, the electric equipment is added, the step returns to the process 95 and the operations in the process 95 and the processes and decisions successive thereto are performed in the same manner as described above.

What is claimed is:

1. A solar battery system for a vehicle comprising:
   a solar battery mountable on a body of a vehicle for converting solar energy to electric energy so as to produce, without charging electric power converted from solar energy, an output of electric power which varies proportionally in response to changes in quantity of solar radiation supplied to the body,
   load connecting means for connecting selectively at least one of electric equipments provided in the vehicle with said solar battery so as to directly apply said output electric power produced by said solar battery to the electric equipment connected thereby with said solar battery,
   battery output checking means for detecting the magnitude of said output of electric power produced by the solar battery, and
   control means operative to select, in response to the magnitude of the output of electric power produced by said solar battery detected by said battery output checking means, one or more of electric equipments which are to be connected through said load connecting means with said solar battery so as to operate with power consumption corresponding appropriately to the output of electric power produced by said solar battery so that the solar battery is maintained to work at a relatively marrow operating area including an optimal operating point in its output characteristic, said control means being further operative to select none of the electric equipments when the magnitude of the output of electric power produced by said solar battery detected by said battery output checking means is less than a predetermined level.

2. A solar battery system according to claim 1, wherein said control means is operative further to determine the number of electric equipments connected by said load connecting means with said solar battery in response to the magnitude of the output of said solar battery detected by said battery output checking means.

3. A solar battery system according to claim 2, wherein said load connecting means is operative to connect one or more fan motors for driving ventilating fans provided in the body of the vehicle, the number of which is determined by said control means, with said solar battery.

4. A solar battery system according to claim 3, wherein said ventilating fans are disposed at front and rear portions of the body of the vehicle, respectively.

5. A solar battery system according to claim 1, wherein said load connecting means is provided for connecting a plurality of electric equipments selected by said control means in parallel with each other with said solar battery.

6. A solar battery system according to claim 5, wherein said control means is operative further to determine the number of electric equipments connected by said load connecting means with said solar battery in response to the magnitude of the output of said solar battery detected by said battery output checking means.

7. A solar battery system according to claim 6, wherein said load connecting means is operative to connect one or more fan motors for driving ventilation fans provided in the body of the vehicle with said solar battery, and said control means determines the number of the ventilation fans which are connected.

8. A solar battery system according to claim 5 further comprising display means connected with said control means for indicating the electric equipments selected by said control means.

9. A solar battery system according to claim 8, wherein said load connecting means comprises a coupling device for coupling detachably with the electric equipments selected by said control means so as to connect said electric equipments with said solar battery.

10. A solar battery system according to claim 9, wherein said control means is provided with switching means for causing said control means to select one or more electric equipments which can be supplied with electric power sufficient for operating properly through said load connecting means from said solar battery under a situation in which at least one electric equipment is coupled with said coupling means.

11. A solar battery system according to claim 1 further comprising display means connected with said control means for indicating said one or more electric equipments selected by said control means.

12. A solar battery system according to claim 11, wherein said load connecting means comprises a coupling device for coupling detachably with said one or more electric equipments so as to connect said one or more electric equipments with said solar battery.

13. A solar battery system according to claim 12, wherein said coupling means comprises a plurality of coupling devices for coupling detachably with the electric equipments selected by said control means so as to connect said electric equipments with said solar battery.

14. A solar battery system according to claim 13, wherein said control means is provided with switching means for causing the control means to select one or more electric equipments which can be supplied with electric power sufficient for operating properly through said load connecting means from said solar battery under a situation in which at least one electric equipment is coupled with said coupling means.

15. A solar battery system according to claim 14, wherein said control means is operative further to cause said display means to indicate said one or more electric equipments selected by said control means under the situation in which at least one electric equipment is coupled with said coupling means when said switching means is made effective.

16. A solar battery system for a vehicle comprising:
a solar battery mountable on a body of a vehicle for converting solar energy to electric energy so as to produce, without charging energy converted from solar energy, an output of electric power which varies proportionately in response to changes in quantity of solar radiation supplied to the body,
loan connecting means for connecting selectively at least one of fan motors for driving ventilation fans provided in the vehicle with said solar battery so as to directly apply said output of electric power produced by said solar battery to the fan motor connected thereby with said solar battery,
battery output checking means for detecting the magnitude of said output of electric power produced by the solar battery, and
control means operative to select, in response to the magnitude of the output of electric power produced by said solar battery detected by said battery output checking means, one or more of fan motors which are to be connected through said load connecting means with said solar battery so as to operate with power consumption corresponding appropriately to the output of electric power produced by said solar battery so that the solar battery is maintained to work at a relatively marrow operating area including an optimal operative point in its output characteristic, said control means being further operative to select none of the fan motor when the magnitude of the output of electric power produced by said battery detected by said battery output means is less than a predetermined level.

17. A solar battery system according to claim 1, further comprising a parking detecting circuit for detecting a parking condition of the vehicle and generating a signal indicative of a parking condition of the vehicle.

18. A solar battery system according to claim 17, wherein said control means is operative to cause said load connecting means not to connect any electrical equipment with the solar battery in the absence of a parking condition of the vehicle being detected by the parking detecting circuit.

19. A solar battery system according to claim 16, further comprising a parking detecting circuit for detecting a parking condition of the vehicle and generating a signal indicative of a parking condition of the vehicle.

20. A solar battery system according to claim 19, wherein said control means is operative to cause said load connecting means not to connect any fan motors with the solar battery in the absence of a parking condition of the vehicle being detected by the parking detecting circuit.

* * * * *